United States Patent [19]

Murphy

[11] Patent Number: 5,716,720
[45] Date of Patent: Feb. 10, 1998

[54] THERMAL BARRIER COATING SYSTEM WITH INTERMEDIATE PHASE BONDCOAT

[75] Inventor: Kenneth S. Murphy, Norton Shores, Mich.

[73] Assignee: Howmet Corporation, Greenwich, Conn.

[21] Appl. No.: 407,224

[22] Filed: Mar. 21, 1995

[51] Int. Cl.⁶ .......................... B32B 15/04; B05D 3/02; C23C 10/60; C23C 16/56
[52] U.S. Cl. .......................... 428/623; 428/629; 428/678; 428/938; 148/537; 416/241 R; 416/241 B
[58] Field of Search .................. 428/623, 632, 428/633, 629, 652, 678, 668, 680, 938; 416/241 R, 241 B; 427/250, 255.7; 148/537

[56] References Cited

U.S. PATENT DOCUMENTS

| | | | |
|---|---|---|---|
| Re. 31,339 | 8/1983 | Dardi et al. | 428/678 |
| 3,542,530 | 11/1970 | Talboom, Jr. | 29/183.5 |
| 3,676,085 | 7/1972 | Evans et al. | 29/194 |
| 3,754,903 | 8/1973 | Goward et al. | 75/171 |
| 3,819,338 | 6/1974 | Bungardt et al. | 29/194 |
| 3,928,026 | 12/1975 | Iecht et al. | 75/134 |
| 3,979,273 | 9/1976 | Panzera et al. | 428/670 |
| 3,999,956 | 12/1976 | Stueber et al. | 428/678 |
| 4,055,705 | 10/1977 | Stecura et al. | 423/637 |
| 4,070,507 | 1/1978 | Stueber et al. | 427/252 |
| 4,321,311 | 3/1982 | Strangman | 428/623 |
| 4,339,509 | 7/1982 | Dardi et al. | 428/632 |
| 4,346,137 | 8/1982 | Hecht | 428/678 |
| 4,405,659 | 9/1983 | Strangman | 427/248 |
| 4,501,776 | 2/1985 | Shankar | 427/253 |
| 4,526,814 | 7/1985 | Shankar et al. | 427/253 |
| 4,656,099 | 4/1987 | Sievers | 428/610 |
| 4,676,994 | 6/1987 | Demaray | 427/42 |
| 4,861,618 | 8/1989 | Vine et al. | 427/34 |
| 4,880,614 | 11/1989 | Strangman | 428/623 |
| 4,919,773 | 4/1990 | Naik | 204/38.4 |
| 5,015,502 | 5/1991 | Strangman et al. | 427/248.1 |
| 5,057,196 | 10/1991 | Creech et al. | 204/181.5 |
| 5,087,477 | 2/1992 | Giggins, Jr. et al. | 427/38 |
| 5,139,824 | 8/1992 | Liburdi et al. | 427/252 |
| 5,236,745 | 8/1993 | Gupta et al. | 427/454 |
| 5,238,752 | 8/1993 | Duderstadt et al. | 428/623 |
| 5,262,245 | 11/1993 | Ulion et al. | 428/469 |
| 5,292,594 | 3/1994 | Liburdi et al. | 428/650 |
| 5,514,482 | 5/1996 | Strangman | 428/623 |

OTHER PUBLICATIONS

Evaluation of Simple Aluminide and Platinum Modified Aluminide Coatings on High Pressure Turbine Blades After Factory Engine Testing, Jun., 1991, pp. 1–8, Connor, et al.

(List continued on next page.)

*Primary Examiner*—John Zimmerman

[57] ABSTRACT

A thermal barrier protected nickel based or cobalt based superalloy component for use in a gas turbine engine includes a thermal barrier coating system having a multi-layered structure. The first bondcoat layer of the thermal barrier coating system comprises a chemical vapor deposited, platinum modified diffusion aluminide layer on the superalloy component (substrate). The diffusion aluminide layer includes an inner diffusion zone proximate the substrate and an outer layer region comprising a platinum modified (platinum-bearing) intermediate phase of aluminum and at least one of nickel and cobalt depending on the superalloy composition. The intermediate phase is a non-ordered solid solution having a range of compositions and is free of other phase constituents. The intermediate phase has an average aluminum concentration in the range of about 18 to about 26% by weight, an average platinum concentration in the range of about 8 to about 35% by weight, and an average nickel concentration in the range of about 50 to 60% by weight and is non-stoichiometric relative to intermetallic compounds of aluminum and nickel, aluminum and cobalt, and aluminum and platinum. An adherent alpha alumina layer is thermally grown on the diffusion aluminide layer and receives an outer ceramic thermal barrier layer deposited thereon.

17 Claims, 3 Drawing Sheets

OTHER PUBLICATIONS

Evaluation of Simple Aluminide and Platinum Modified Aluminide Coatings on High Pressure Turbine Blades After Factory Engine Testing—Round II, Jun., 1992, pp.1–11, Connor.

Platinum Modified Aluminides—Present Status, Jun., 1990, pp. 1–10, Smith, et al.

Diffusion Coatings, ASM Handbook, vol. 5, Surface Engineering, pp. 611–620, 1994 no month.

Ductile–to–Brittle Transition Temperature Behavior of Platinum–Modified Coatings; Mat. Sci. and Engineering, 88 (1987) pp. 227–231, Vogel et al. no month.

THERMAL BARRIER COATING SYSTEM WITH INTERMEDIATE PHASE BONDCOAT

FIELD OF THE INVENTION

The present invention relates to thermal barrier coating systems for nickel-based and cobalt-based superalloys.

BACKGROUND OF THE INVENTION

Thermal barrier coating systems of various types are well known in the gas turbine engine industry as one means for protecting nickel-based and cobalt-based superalloy components, such as turbine blades and vanes, from oxidation and corrosion during engine operation.

One type of thermal barrier coating system involves depositing on the superalloy component (substrate) to be protected an MCrAlY metal alloy overlay where M is iron, nickel, cobalt, or a combination thereof, oxidizing the metal alloy overlay to form an alumina layer in-situ on the bondcoat, and then depositing a ceramic thermal barrier layer having columnar morphology on the alumina layer. Such a thermal barrier coating is described in U.S. Pat. Nos. 4,321,310 and 4,321,311.

Another type of thermal barrier coating system exemplified by U.S. Pat. No. 5,238,752 involves forming on the superalloy component (substrate) to be protected a high aluminum, atomically ordered intermetallic compound as a bondcoat. The intermetallic compound comprises, for example, equiatomic nickel aluminide (NiAl) having an Al content of 31.5% by weight or platinum modified nickel aluminide known commercially as Chromalloy RT-22 having a high aluminum intermetallic NiAl Al matrix and including $PtAl_2$ phases in the coating microstructure. The intermetallic compound bondcoat is oxidized to form a thermally grown alumina layer in-situ thereon, and then a ceramic thermal barrier layer having columnar or other morphology is deposited on the alumina layer.

Still another type of thermal barrier coating system exemplified by U.S. Pat. Nos. 4,880,614 and 5,015,502 involves forming on the superalloy component (substrate) to be protected a metallic bondcoat which may comprise an MCrAlY metal alloy overlay or a diffusion aluminide layer predominantly composed of aluminum intermetallic (e.g. NiAl, CoAl, and (Ni/Co)Al phases) which may be modified with Pt, Si, Hf, Cr, Mn, Ni, Co, Rh, Ta, Nb, and/or particulates, chemical vapor depositing (CVD) a high purity alpha alumina layer on the metallic bondcoat, and depositing a ceramic thermal barrier layer on the CVD alpha alumina layer.

In the manufacture of thermal barrier coating systems, the ceramic thermal barrier material, such as yttria stalized zirconia, has been applied to the bondcoat by plasma spraying wherein coating adherence is promoted by the roughness of the bondcoat. Controlled porosity and microcracking within the ceramic thermal barrier layer accommodates strain developed due to the differences in thermal expansion coefficients between the ceramic and the substrate superalloy. Alternately, ceramic thermal barrier material has been applied to the bondcoat by physical vapor deposition (PVD), such as sputtering and electron beam evaporation, under conditions to produce a columnar morphology (i.e. independent ceramic columns) in the ceramic thermal barrier layer. This columnar morphology organizes the coating porosity between the columns to accommodate strain from thermal expansion mismatch between the substrate and ceramic thermal barrier layer.

An object of the present invention is to provide an improved thermal barrier coating system for use on gas turbine engine and other superalloy components or articles operating at elevated temperatures where oxidation and corrosion protection is needed.

Another object of the present invention is to provide a thermal barrier coating system by an improved method which results in advantages in the manufacture of thermal barrier coating systems.

SUMMARY OF THE INVENTION

The present invention provides a thermal barrier protected nickel based or cobalt based superalloy component, and method of making same, for use in a gas turbine engine wherein the thermal barrier coating system includes a multi-layered structure. The first bondcoat layer of the thermal barrier coating system comprises a chemical vapor deposited, platinum modified diffusion aluminide layer on the superalloy component (substrate). The diffusion aluminide layer includes an inner diffusion zone proximate the substrate and an outer layer region comprising a platinum modified (platinum-bearing) intermediate phase of aluminum and at least one of nickel and cobalt depending on the superalloy composition.

For example, for nickel based superalloy substrates, the intermediate nickel-aluminum phase resides in the beta solid solution intermediate phase region of the binary nickel-aluminum phase diagram. For cobalt based superalloy substrates, the intermediate phase resides in the zeta phase region of the binary cobalt-aluminum phase diagram. The intermediate phase is a solid solution having a range of compositions and is substantially free of other phase constituents. The intermediate phase has an average aluminum concentration (through the outer layer region thickness) in the range of about 18 to about 26% by weight, an average platinum concentration (through the layer thickness) in the range of about 8 to about 35% by weight, and an average nickel concentration (through the layer thickness) in the range of about 50 to 60% by weight and is non-stoichiometric relative to intermetallic compounds of aluminum and nickel, aluminum and cobalt, or aluminum and platinum. For example, the intermediate phase is hypostoichiometric in aluminum relative to the intermetallic compounds AlNi and $Al_2Ni_3$ employed heretofore as bondcoats in thermal barrier coating systems.

The platinum modified diffusion aluminide layer preferably is formed by depositing a layer of platinum or alloy thereof on the substrate and chemical vapor depositing aluminum on the platinum covered susbtrate under high temperature and low aluminum activity conditions to form the inner diffusion zone and the outer intermediate phase region.

An adherent alumina layer is thermally grown on the diffusion aluminide layer by, for example, oxidizing the outer layer region in a low partial pressure oxygen atmosphere at a temperature greater than about 1800 degrees F. that promote in-situ formation of alpha alumina. The thermally grown alumina layer receives an outer ceramic thermal barrier layer thereon, preferably deposited by electron beam evaporation of ceramic thermal barrier material and condensation on the alumina layer.

The invention is advantageous in that a kinetically stable diffusion aluminide layer is produced by a long time CVD exposure at high temperature/low aluminum activity to produce a diffusion aluminide layer with an intermediate, non-stoichiometric single phase microstructure formed at the outer layer region on top of which the alumina layers and ceramic thermal barrier layer reside. The spallation of the ceramic thermal barrier layer is improved significantly as compared to thermal barrier spallation on a like substrate having a two-phase (stoichiometric NiAl plus PtAl₂ intermetallic) platinum modified diffusion aluminide bondcoat (the aforementioned RT22 aluminide) with a thermally grown alumina layer between the bondcoat and the thermal barrier layer.

DESCRIPTION OF THE INVENTION

Figure 1:
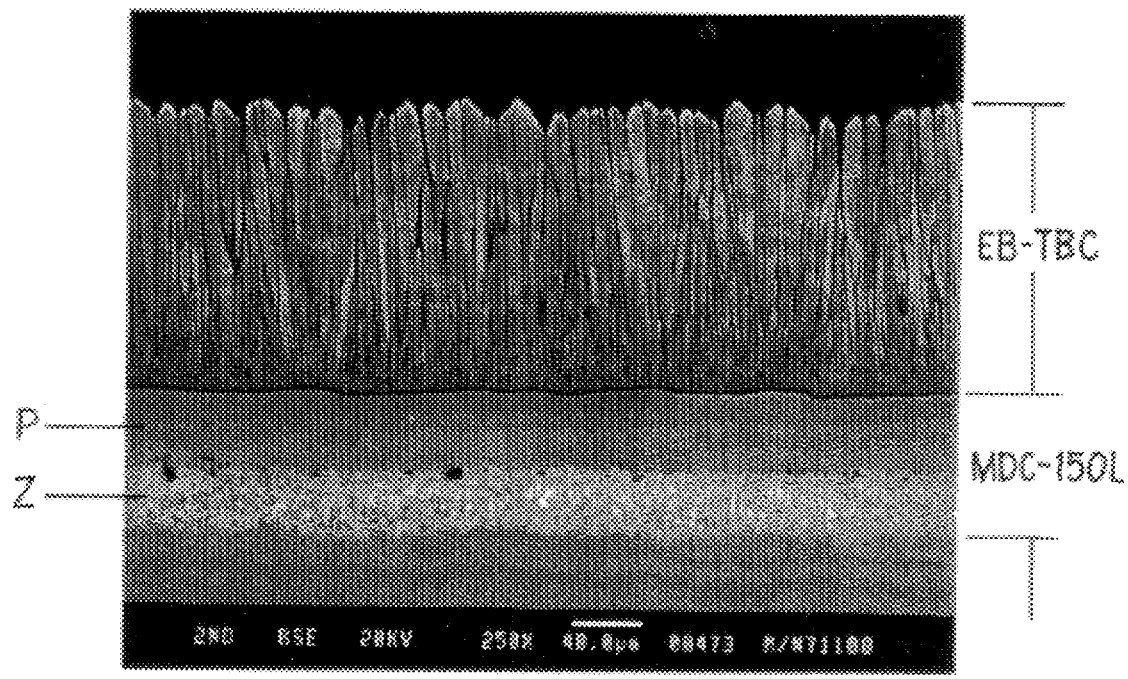
FIG. 1 is a scanning electron micrograph of a thermal barrier protected nickel based substrate in accordance with an embodiment of the present invention.

FIG. 1 is a scanning electron micrograph of a thermal barrier protected nickel-based superalloy substrate in accordance with an embodiment of the present invention. As is apparent, the thermal barrier coating system comprises a multi-layered structure comprising a first bondcoat layer designated MDC-150L in FIG. 1, a thermally grown alumina layer on the bondcoat, and a ceramic thermal barrier layer designated EB-TBC on the thermally grown alumina layer.

The present invention can be used with known nickel based and cobalt based superalloy substrates which may comprise equiaxed, DS (directionally solidified) and SC (single crystal) castings as well as other forms of these superalloys, such as forgings, pressed superalloy powder components, machined components, and other forms. For example only, the examples set forth below employ the well known René alloy N5 nickel base superalloy having a composition of Ni-7.0% Cr- 6.2% Al-7.5% Co-6.5% Ta-1.5% Mo-5.0% W-3.0% Re-0.15% Hf-0.05% C-0.018% Y (% by weight) used for making SC turbine blades and vanes. Other nickel base superalloys which can be used include, but are not limited to, MarM247, CMSX-4, PWA 1422, PWA 1480, PWA 1484, René 80, René 142, and SC 180. Cobalt based superalloys which can be used include, but are not limited to, FSX-414, X-40, and MarM509.

The bondcoat layer designated MDC-150L comprises a chemical vapor deposited, platinum modified diffusion aluminide layer on the Ni-based superalloy subtrate. The diffusion aluminide layer includes an inner diffusion zone proximate the nickel base superalloy substrate and an outer layer region comprising a platinum modified (platinum-bearing) intermediate phase of aluminum and nickel (or cobalt depending on the superalloy composition). The overall thickness of the bondcoat is in the range of about 1.5 to about 3.0 mils.

Figure 2:
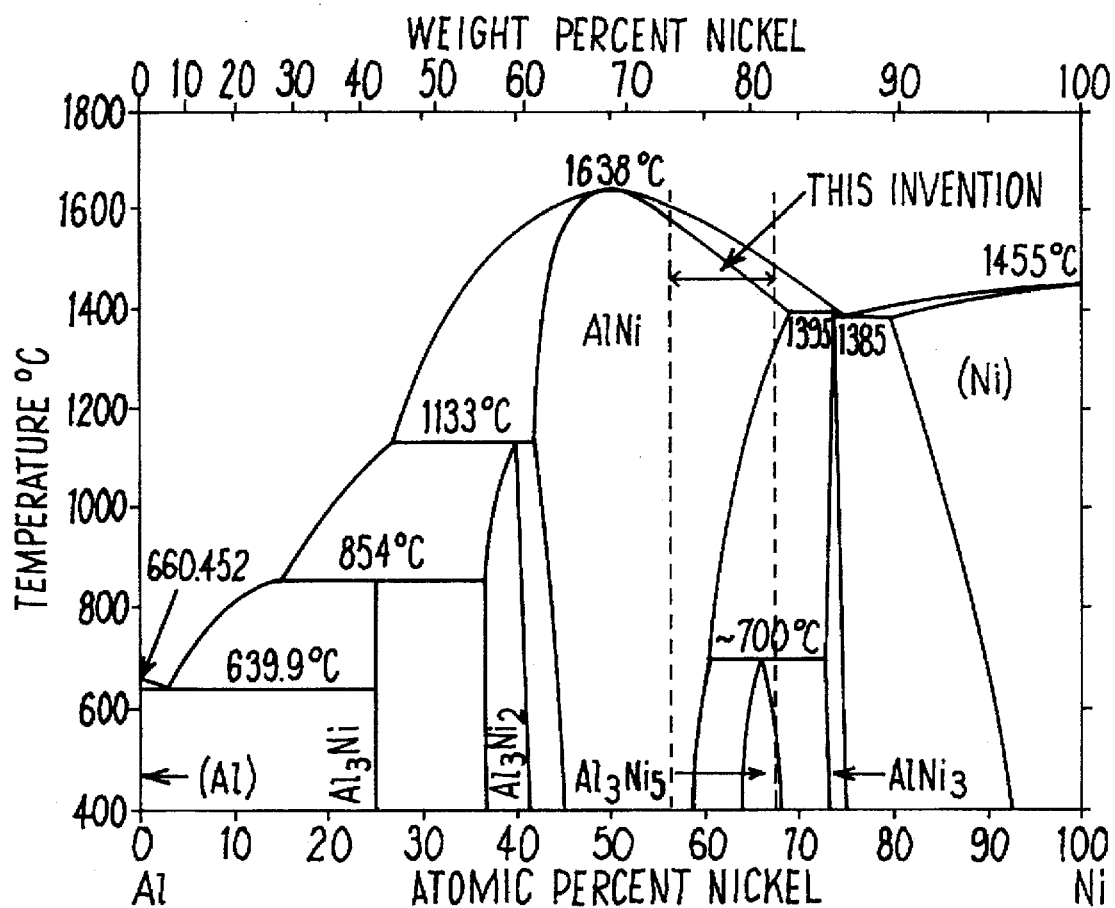
FIG. 2 is a phase diagram for the binary nickel-aluminum system.

For example, for nickel based superalloy substrates, the intermediate nickel-aluminum phase resides in the beta solid solution intermediate phase region of the binary nickel-aluminum phase diagram shown in FIG. 2. For cobalt based superalloy substrates, the intermediate phase resides in the zeta phase region of the binary cobalt-aluminum phase diagram which can be found in Binary Alloy Phase Diagrams, American Society of Metals, Editor-In-Chief Thaddeus B. Massalski, 1986. The intermediate phase is a metallic solid solution having a range of compositions and is substantially free of other phase constituents (i.e. minor amounts such as less than 5 volume % of other phases may occur in the microstructure).

The intermediate phase has an average aluminum concentration (through the layer thickness) in the range of about 18 to about 26% by weight, an average platinum concentration (through the layer thickness) in the range of about 8 to about 35% by weight, and an average nickel concentration (through the layer thickness) in the range of about 50 to 60% by weight and is non-stoichiometric relative to intermetallic compounds of aluminum and nickel, aluminum and cobalt, and aluminum and platinum. For example, the intermediate phase is hypostoichiometric in aluminum relative to the intermetallic compounds AlNi and Al₂Ni₃ employed heretofore as bondcoats in thermal barrier coating systems.

When the substrate is first platinum plated followed by CVD aluminizing, the aluminum and platinum concentrations in the intermediate phase layer are graded such that the aluminum concentration is highest at an outer surface of the outer layer region and the platinum concentration is highest proximate the inner diffusion zone. The nickel concentration decreases from the outer surface toward the diffusion zone.

The platinum modified diffusion aluminide layer preferably is formed by depositing a layer of platinum or alloy thereof on the substrate and chemical vapor depositing aluminum on the platinum covered substrate under high temperature and low aluminum activity conditions described in copending application Ser. No. 08/330,694 of common assignee herewith, the teachings of which are incorporated herein by reference with respect to CVD formation of the platinum modified diffusion aluminide layer. The deposition conditions are controlled to form the inner diffusion zone Z of FIG. 1 and the outer intermediate single phase region P of FIG. 1 as an additive region to the nickel based superalloy substrate by virtue of outward diffusion of substrate nickel and other substrate alloying elements. Other elements may be added to the bondcoat during CVD formation. For example, such elements as Si, Hf, Y, and other Lanthanide and Actinide series elements with favorable chlorination thermodynamics can be added to the layer as disclosed in the aforementioned copending application Ser. No. 08/330,694.

For example, generally, the substrate is electroplated with a 9–11 milligram/centimeter squared platinum layer (e.g. 2 mil thick Pt layer) and then subjected, without a Pt prediffusion treatment, to CVD aluminizing at a substrate temperature greater than 1000 degrees C. (e.g. 1080 degrees C.) and contacting a high purity coating gas mixture comprising hydrogen carrier gas (less than 30 parts per billion impurities) and aluminum trichloride gas (less than 25 parts per million impurities) that result in a decrease in the concentrations of deleterious substrate substitutional alloying elements, such as W, Cr, Ti, and Mo, and surface active tramp elements, such as B, P, and S.

A typical CVD coating gas mixture comprises 9 volume % aluminum trichloride and 91 volume % hydrogen at a flow rate of 300 scfm. More generally, the aluminum trichloride gas typically does not exceed 10 volume % of the coating gas mixture, and preferably is in the range of 4 to 6 volume % of the coating gas mixture. The coating gas flow rate typically is within the range of 200 to 400 scfm. As mentioned, the substrate temperature is greater than 1000 degrees C.

Coating gas mixture for forming the bondcoat can be generated by passing high purity hydrogen (less than 30 ppb impurities) and high purity hydrogen chloride (less than 25 ppm impurities) in mixture of hydrogen/13 volume % HCl over a 99.999% pure source of aluminum at 290 degrees C. as set forth in the aforementioned copending application Ser. No. 08/330,694.

The thin adherent alpha alumina layer is thermally grown on the diffusion aluminide layer designated MDC-150L under conditions effective to form an alpha alumina layer, rather than other forms of alumina, such as gamma alumina. For example, the diffusion aluminide layer is oxidized in a low partial pressure oxygen atmosphere, such as a vacuum less than $10^{-4}$ torr, or argon or hydrogen partial pressures having oxygen impurities at temperatures greater than about 1800 degrees F. that promote in-situ formation of the alpha phase alumina. The thickness of the alpha alumina layer is in the range of about 0.01 to 2 microns.

For purposes of illustration, the alpha alumina layer can be formed in-situ by evacuating a vacuum furnace to $1 \times 10^{-6}$ torr and backfilling with argon having oxygen impurities to 10 torr, ramping the substrate having the platinum modified diffusion aluminide layer thereon to 1925 degrees F., holding at temperature for one hour, and cooling to room temperature for removal from the furnace.

Figure 4:
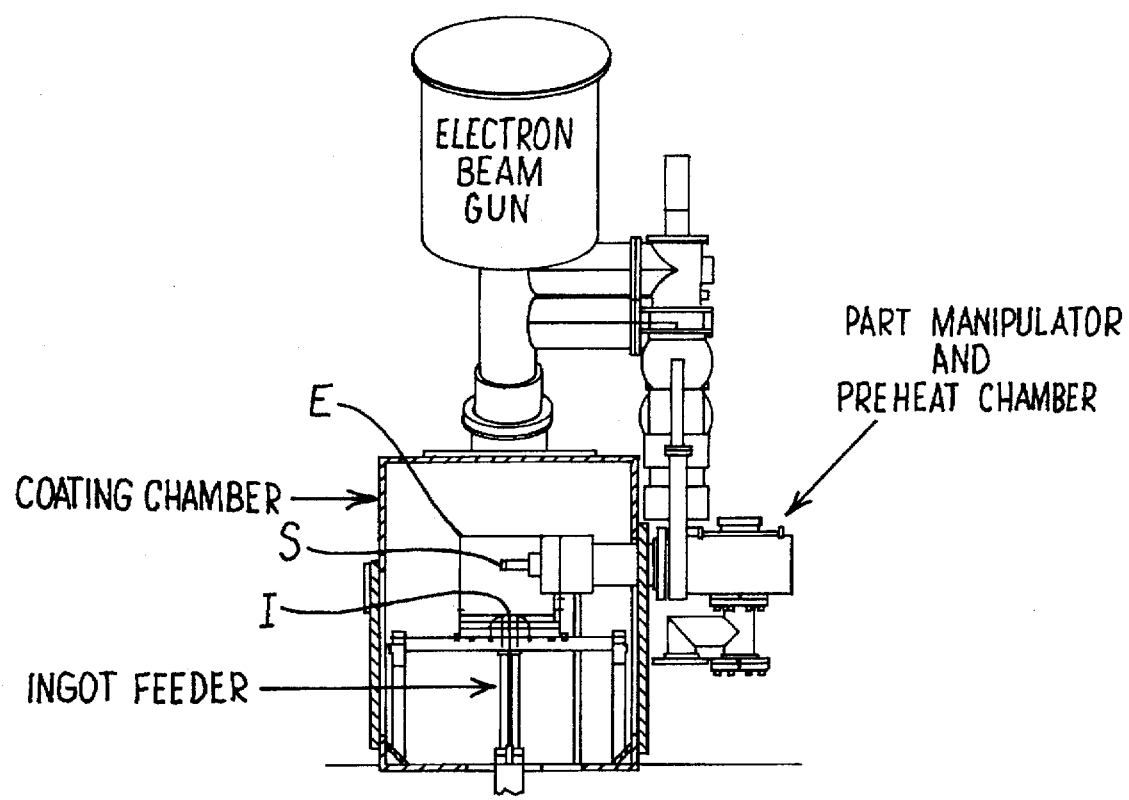
FIG. 4 is a schematic diagram of ceramic thermal barrier coating apparatus that can be used in practicing the invention.

The thermally grown alpha alumina layer receives an outer ceramic thermal barrier layer designated EB-TBC in FIG. 1. In one embodiment of the invention, the ceramic thermal barrier layer can be deposited on the alpha alumina layer by electron beam physical vapor deposition apparatus shown schematically in FIG. 4 wherein a source (e.g. ingot feeder in FIG. 1) of ceramic thermal barrier material is evaporated by electron beam heating from the electron beam gun and condensed on the alpha alumina layer of the substrate(s) S positioned and rotated in a coating chamber typically above the source of ceramic thermal barrier material in the vapor cloud from the source.

For example, the loading and preheat chamber shown connected to the thermal barrier coating chamber is first evacuated to below $1 \times 10^{-4}$ torr and the substrate mounted on a rotatable shaft (part manipulator) is heated therein to 1750 degrees F. in the loading/preheat chamber. In the coating chamber, an electron beam (power level of 65 kW) from the electron beam gun is scanned (rate of 750 Hertz) over an ingot I of yttria stablized zirconia (or other thermal barrier ceramic material) to evaporate it. The electron beam scans the ingot at an angle to avoid the substrates and back reflection of the beam. For zirconia based materials, oxygen is introduced into the coating chamber to produce a pressure of 1–20 microns ensuring a deposition of a white near-stoichiometric yttria stablized zirconia deposit is formed on the alumina. To minimize heat loss, the preheated coated substrate(s) S then is/are rapidly moved on the shaft from the loading/preheat chamber to a coating position in heat reflective enclosure E in the coating chamber above the ingot I. The enclosure includes an opening for the electron beam to enter. The substrate is rotated by the shaft at a speed of 30 rpm about 11 inches above the ingot, although the spacing can be from about 10–15 inches. Deposition is conducted for a time to produce the desired thickness of ceramic thermal barrier layer. Typical thickness of the thermal barrier layer is in the range of 4 to 12 mils (0.004 to 0.012 inch).

The present invention is not limited to forming a thermal barrier layer having columnar grain microstructure shown in FIG. 1. Other thermal barrier layer structures may be employed. For example, a plurality of alternating thin layers of yttria stablized zirconia and alumina (each approximately one micron thick) can be electron beam PVD deposited on the alumina layer as the thermal barrier layer. The number of individual ceramic layers can be controlled to provide a desired thermal barrier layer thickness.

For purposes of illustration and not limitation, substrate specimens of a thermal barrier protected René alloy N5 substrate were made pursuant to an embodiment of the invention for cyclic oxidation testing. The specimens were one inch in diameter and 0.125 inches in thickness and were ground flat and then media finished with polishing stones to round sharp edges. The bondcoat designated MDC-150L was formed using the following parameters:

substrate temperature: 1975 degrees F.

coating gas: 280 cubic feet per hour (cfh) hydrogen and 12 cfh of HCl to generate $AlCl_3$ from the aforementioned high purity aluminum bed coating gas flow rate: 292 cfh for a coating time to yield an MDC-150L coating thickness of 2.4 to 2.6 mils on the substrate specimens.

The alpha alumina layer was formed on the bondcoat coated specimens by heat treating in an argon environment by first evacuating a vacuum chamber to $1 \times 10^{-6}$ torr and backfilling to 10 torr with shop argon having sufficient oxygen impurities to form alumina at temperature, ramping the substrate to temperature of above 1800 degrees F. (e.g. 1925 degrees F.), holding at temperature for one hour, and cooling to room temperature for removal from the furnace.

Eight substrate specimens next were attached on the rotatable shaft of the aforementioned electron beam PVD coating apparatus in the loading/preheat chamber. The chamber was evacuated $10^{-4}$ torr and the substrate specimens heated to 1760 degrees F. Once the specimen temperature had equilibrated, the specimens were translated on the shaft into the coating chamber. Prior to movement into the coating chamber, the coating chamber was stabilized to achieve an oxygen pressure of 6–8 microns at 1970 degrees F. while the electron beam at a power level of 65 kW was scanned at a rate of 750 Hertz across a 7–8 weight % yttria stabilized zirconia ingot. The specimens were rotated at 30 rpm over the molted ceramic pool in the vapor cloud for 19 minutes to deposit a 4.2 to 4.4 mil thick columnar yttria stablized zirconia coating on the alpha alumina layer.

A typical microstructure of the thermal barrier coating system so formed is shown in FIG. 1 and described hereabove. As is apparent, the thermal barrier coating system comprises a multi-layered structure comprising the first bondcoat layer designated MDC-150L, the thermally grown alumina layer on the bondcoat, and the ceramic thermal barrier layer designated EB-TBC on the thermally grown alumina layer.

Table I below sets forth Al, Pt, and Ni average concentrations through the thickness of the bondcoat for several alloy N5 substrate specimens with the thermal barrier layer.

Figure 3:
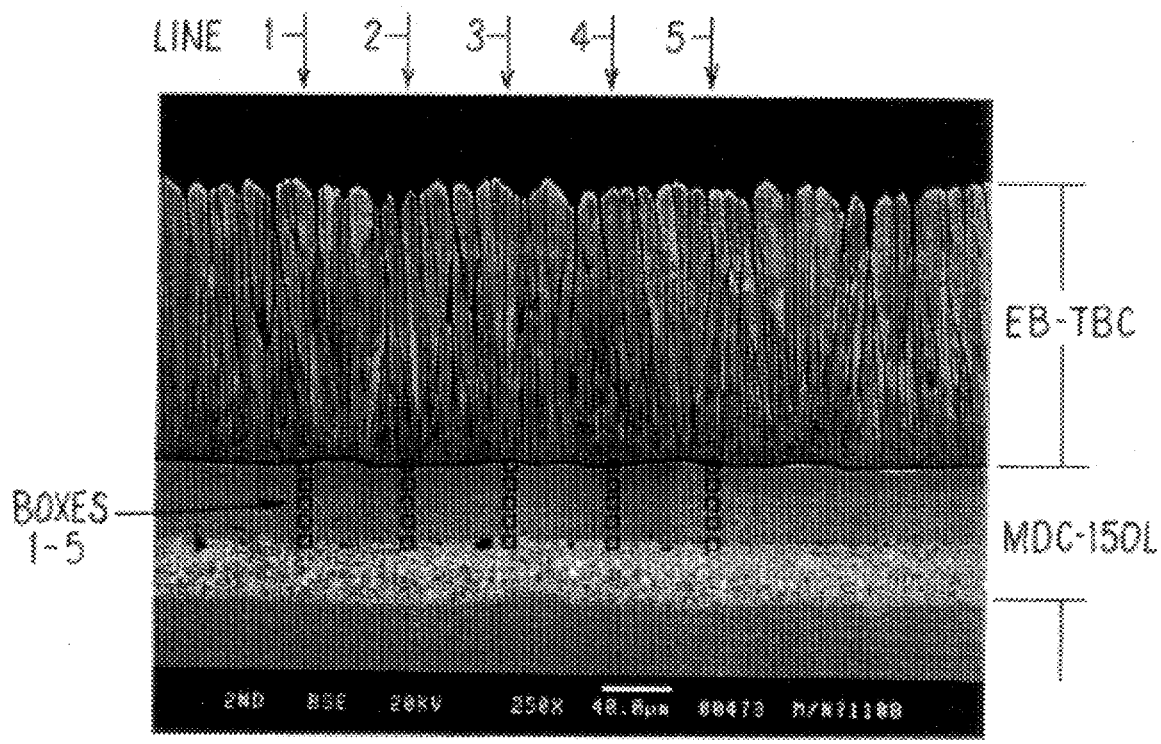
FIG. 3 is similar to FIG. 1 but marked to indicate how chemical analyses were conducted for Al, Pt, and Ni in the bondcoat by microprobe using wavelength dispersive spectroscopy.

The alloyant concentrations were measured by a microprobe using wavelength dispersive spectroscopy wherein a electron beam is controlled to form a box pattern or shape approximately 5 microns by 5 microns in dimension from which X-rays characteristic of the elements present are emitted and analyzed. A line of usually 5 such analysis boxes was used to make measurements from the top of the bondcoat progessively toward the diffusion zone Z through the bondcoat thickness (e.g. see FIG. 3).

The data for each of Al, Pt, and Ni from each analysis box were averaged for each line. This measuring technique was repeated at five different locations (at five different electron beam lines) on the bondcoat. The averaged data for each different line or location #1–#5 is set forth in Table I along with the average data for all lines and all data.

TABLE I

| Mount No. | Alloy | TBC Run No. | Average Wt. % | | | | |
|---|---|---|---|---|---|---|---|
| | | | Al | Pt | Ni | Others | |
| 71286 | N5 | 1-27 | 21.5 | 15.6 | 54.1 | 8.8 | #1 |
| | | | 21.3 | 15.6 | 54.6 | 8.5 | #2 |
| | | | 21.6 | 15.9 | 55.1 | 7.4 | #3 |
| | | | 21.5 | 16.4 | 54.1 | 8.0 | #4 |
| | | | 21.4 | 16.6 | 54.8 | 7.2 | #5 |
| | | Average | 21.5 | 16.0 | 54.5 | 8.0 | |
| | | Minimum | 19.9 | 14.0 | 52.1 | | |
| | | Maximum | 22.8 | 17.6 | 57.3 | | |
| 71285 | N5 | 1-27 | 22.1 | 15.5 | 53.4 | 9.0 | #1 |
| | | | 22.5 | 15.8 | 54.5 | 7.2 | #2 |
| | | | 22.7 | 16.0 | 54.6 | 7.5 | #3 |
| | | | 22.2 | 16.2 | 53.6 | 8.0 | #4 |
| | | | 22.5 | 15.8 | 54.0 | 7.7 | #5 |
| | | Average | 22.4 | 15.9 | 54.0 | 7.7 | |
| | | Minimum | 20.9 | 13.3 | 51.9 | | |
| | | Maximum | 24.2 | 17.4 | 57.4 | | |
| 71284 | N5 | 1-27 | 23.0 | 15.4 | 54.5 | 7.1 | #1 |
| | | | 22.4 | 16.6 | 53.5 | 7.5 | #2 |
| | | | 22.6 | 16.4 | 54.0 | 7.0 | #3 |
| | | | 22.5 | 16.7 | 53.8 | 7.0 | #4 |
| | | | 22.3 | 17.7 | 53.2 | 6.8 | #5 |
| | | Average | 22.6 | 16.6 | 53.8 | 7.0 | |
| | | Minimum | 20.5 | 11.9 | 51.1 | | |
| | | Maximum | 25.3 | 19.3 | 58.6 | | |

All Data

| | Average Wt. % | | |
|---|---|---|---|
| Average | 22.2 | 16.2 | 54.1 |
| Minimum | 19.9 | 11.9 | 51.1 |
| Maximum | 25.3 | 19.3 | 58.6 |

The specimens were tested in a 2075 degree F. cyclic oxidation test where the thermal barrier protected specimens of the invention were subjected to test cycles each 60 minutes in duration consisting of a 2075 degree F. exposure for 50 minutes in air followed by 10 minutes of cooling in air to below 300 degrees F. The following Table II summarizes the cyclic oxidation testing. For comparison, thermal barrier spallation on a like Alloy N5 substrate having a two-phase (stoichiometric NiAl plus PtAl₂ intermetallic) platinum modified diffusion aluminide bondcoat (the aforementioned RT22 aluminide) with a thermally grown alumina layer between the bondcoat and the thermal barrier layer is shown in Table II.

TABLE II

Ceramic Spallation Test

| Bondcoat | Tests | Ave. Cycles to Failure |
|---|---|---|
| MDC-150L | 3 | 820 |
| Prior Art (Platinum Aluminide) | 10 | 380 |

It is apparent that the thermal barrier coating system of the specimens of the invention exhibited spallation of the yttria stabilized zirconia layer after an average of 820 cycles as compared to to only 380 cycles to spallation for the comparsion specimens outside the invention.

The invention is advantageous in that a thermally stable diffusion aluminide layer is produced by high temperature/low aluminum activity/relatively long time CVD exposure to produce an outward diffusion aluminide layer with an intermediate, non-stoichiometric single phase microstructure formed at the outer layer region on top of which the alumina layer and ceramic thermal barrier layer reside.

I claim:

1. An article for use in a gas turbine engine, comprising: a substrate selected from the group consisting of a nickel base superalloy substrate and cobalt based superalloy substrate,
a chemical vapor deposited, diffusion aluminide layer formed on the substrate, said aluminide layer having an outer layer region comprising a solid solution intermediate phase and having an inner diffusion zone region proximate the substrate, said intermediate phase having an average aluminum concentration in the range of about 18 to about 26% by weight, an average platinum concentration in the range of about 8 to about 35% by weight, and an average nickel concentration in the range of about 50 to about 60% by weight so as to be non-stoichiometric relative to intermetallic compounds of aluminum and nickel, aluminum and cobalt, or aluminum and platinum, said outer layer region being substantially free of phase constituents other than said intermediate phase,
an alumina layer on the aluminide layer, and
a ceramic thermal barrier layer on the alumina layer.

2. The article of claim 1 wherein said intermediate phase resides in a beta solid solution intermediate phase region of a binary nickel-aluminum phase diagram.

3. The article of claim 1 wherein said intermediate phase resides in a zeta phase region of a binary cobalt-aluminum phase diagram.

4. The article of claim 1 wherein said outer layer region is about 0.1 to 3.0 mils in thickness.

5. The article of claim 1 wherein said ceramic thermal barrier layer comprises a columnar microstructure.

6. The article of claim 1 wherein said ceramic thermal barrier layer comprises alternating layers of ceramic thermal barrier material.

7. The article of claim 1 wherein the ceramic thermal barrier layer comprises yttria stabilized zirconia.

8. The article of claim 1 wherein the aluminum concentration of said intermediate phase is highest at an outer surface of said outer layer region and said platinum concentration of said intermediate phase is highest proximate the diffusion zone.

9. An article for use in a gas turbine engine, comprising:
a nickel base superalloy substrate,
a chemical vapor deposited, diffusion aluminide layer formed on the substrate, said aluminide layer having an outer layer region comprising a nickel-aluminum solid solution intermediate beta phase and an inner diffusion zone region proximate the substrate, said intermediate phase having an average aluminum concentration in the range of about 18 to about 26% by weight, an average platinum concentration in the range of about 8 to about 35% by weight and an average nickel concentration in the range of about 50 to about 60% by weight so as to be non-stoichiometric relative to intermetallic compounds of aluminum and nickel and of aluminum and platinum, said outer layer region being free of phase constituents other than said intermediate beta phase,
a thermally grown alpha alumina layer on the aluminide layer, and
a ceramic thermal barrier layer vapor deposited on the alumina layer to have a columnar microstructure.

10. The article of claim 9 wherein said outer layer region is about 0.1 to 3.0 mils in thickness.

11. The article of claim 9 wherein the ceramic thermal barrier layer comprises yttria stabilized zirconia.

12. A method of forming a thermal barrier coating on a substrate, comprising:

chemical vapor depositing a diffusion aluminide layer on the substrate selected from the group consisting of a nickel base superalloy substrate and cobalt based superalloy substrate under deposition conditions effective to provide an outer aluminide layer region comprising a solid solution intermediate phase and an inner diffusion zone region proximate the substrate, said intermediate phase having an average aluminum concentration in the range of about 18 to about 26% by weight, an average platinum concentration in the range of about 8 to about 35% by weight, and an average nickel concentration of about 50 to about 60% by weight so as to be non-stoichimetric relative to intermetallic compounds of aluminum and nickel, aluminum and cobalt, or aluminum and platinum, said outer layer region being substantially free of phase constituents other than said intermediate phase, oxidizing the aluminide layer under temperature and oxygen partial pressure conditions effective to form an alpha alumina layer, and depositing a ceramic thermal barrier layer on the alumina layer.

13. The method of claim 12 wherein said intermediate phase resides in a beta solid solution intermediate phase region of a binary nickel-aluminum phase diagram.

14. The method of claim 12 wherein said intermediate phase resides in a zeta phase region of a binary cobalt-aluminum phase diagram.

15. The method of claim 12 wherein said outer layer region is formed to a thickness of about 0.1 to 3.0 mils.

16. The method of claim 12 wherein said alumina layer is formed by heating the diffusion aluminide layer at a temperature greater than 1800 degrees F. at a partial pressure of oxygen less than $10^{-6}$ torr.

17. The method of claim 12 wherein said ceramic thermal barrier layer is deposited by vapor condensation on said substrate so as to have a columnar microstructure.

* * * * *